United States Patent [19]

Tseng et al.

[11] Patent Number: 5,268,820
[45] Date of Patent: Dec. 7, 1993

[54] MOTHER BOARD ASSEMBLY

[75] Inventors: Kun-Ming Tseng, Hsinchu; Yu-Cheng Chang, Tainan, both of Taiwan

[73] Assignee: Mitac International Corp., Hsinchu, Taiwan

[21] Appl. No.: 931,582

[22] Filed: Aug. 18, 1992

[51] Int. Cl.$^5$ ................... H01R 23/68; H01R 23/70
[52] U.S. Cl. ..................... 361/785; 439/44; 439/629; 439/630; 361/760
[58] Field of Search .......... 439/44, 45, 46, 47, 439/48, 53, 64, 65, 74, 629, 630, 803; 361/412, 414, 413, 415, 400, 401, 403, 397, 399

[56] References Cited

U.S. PATENT DOCUMENTS 3,795,888 3/1974 Nardo et al. .
4,133,592 1/1979 Cobaugh et al. .
4,678,252 7/1987 Moore ..................... 439/62

Primary Examiner—Leo P. Picard
Assistant Examiner—Bot Ledynh
Attorney, Agent, or Firm—Hoffmann & Baron

[57] ABSTRACT

A mother board assembly includes a mother board which has a top face and a first connector mounted on the top face. A first mounting seat is mounted on the top face on one side of the first connector and includes at least one resilient first positioning member which is substantially C-shaped. The first positioning member defines a first groove and has two spaced free ends. A second mounting seat is mounted on the top face on the other side of the first connector and includes at least one second positioning member which has a substantially U-shaped retaining portion that defines a second groove. A curved plate portion extends from the retaining portion in a direction away from the first mounting seat. An interface card has a front end, a rear end, a bottom face and a second connector mounted on the bottom face between the front and rear ends.

3 Claims, 3 Drawing Sheets

MOTHER BOARD ASSEMBLY

BACKGROUND OF THE INVENTION

FIELD OF THE INVENTION

This invention relates to personal computers, more particularly to a mother board assembly of a personal computer

DESCRIPTION OF THE RELATED ART

Referring to FIG. 1, a conventional mother board (M1) includes a mother board (A) which has an edge-board connector (A1) mounted thereon and an interface card (B) which has a connecting edge (B1). The connecting edge (B1) of the interface card (B) is press-fitted into the edge-board connector (A1) in a horizontal direction in order to achieve an electrical connection. Since only one end of the interface card (B) is positioned by the edge-board connector (A1), the interface card (B) is liable to incline downward due to the weight thereof. In order to hold the interface card (B) firmly and to achieve a proper electrical connection, the connecting edge (B1) of the interface card (B) must be tightly fitted into the edge-board connector (A1). However, a tight fit connection entails the problems since a greater force is required to pull out or insert the interface card (B). Furthermore, frequent attachment and detachment of the interface card (B) can wear out the connecting edge (B1).

SUMMARY OF THE INVENTION

Therefore, the objective of this invention is to provide an improved mother board assembly. The improved mother board assembly comprises a mother board having a first connector, an interface card having a second connector, and mounting seats mounted on the mother board to clamp firmly the interface card at two ends thereof and to permit the interface card (B) to be removed easily therefrom. The need for a tight fit between the mother board and the interface card is eliminated so that the application of a great force to attach and detach the interface card is not necessary and so that wearing of the first and second connectors is eliminated.

Accordingly, the mother board assembly of the present invention includes a mother board which has a top face and a first connector mounted on the top face, and a first mounting seat which is mounted on the top face of the mother board on one side of the first connector and which includes at least one resilient first positioning member. The first positioning member is substantially C-shaped and defines a first groove therein. The first positioning member has two spaced free ends which define a first access into the first groove.

A second mounting seat is mounted on the top face of the mother board on the other side of the first connector. The second mounting seat is spaced from and is disposed opposite to the first mounting seat. The second mounting seat includes at least one resilient second positioning member which has a substantially U-shaped retaining portion that defines a second groove therein and that has a second access into the second groove. The second positioning member further has a curved plate portion which extends upwardly from the U-shaped retaining portion in a direction away from the first mounting seat.

An interface card has a front end, a rear end, a bottom face and a second connector mounted on the bottom face between the front and rear ends.

The front end of the interface card passes through the first access into the first groove so as to be clamped resiliently between the free ends of the first positioning member. The rear end of the interface card is pressed downward so as to slide along the curved plate portion and extend into the second groove through the second access in order to be retained in the U-shaped retaining portion. The second connector of the interface card mates with the first connector of the mother board to achieve electrical connection between the mother board and the interface card.

BRIEF DESCRIPTION OF THE DRAWINGS

Other features and advantages of the present invention will become apparent in the following detailed description of the preferred embodiment, with reference to the accompanying drawings, of which.

DETAILED DESCRIPTION OF THE PREFERRED EMBODIMENT

Figure 1:
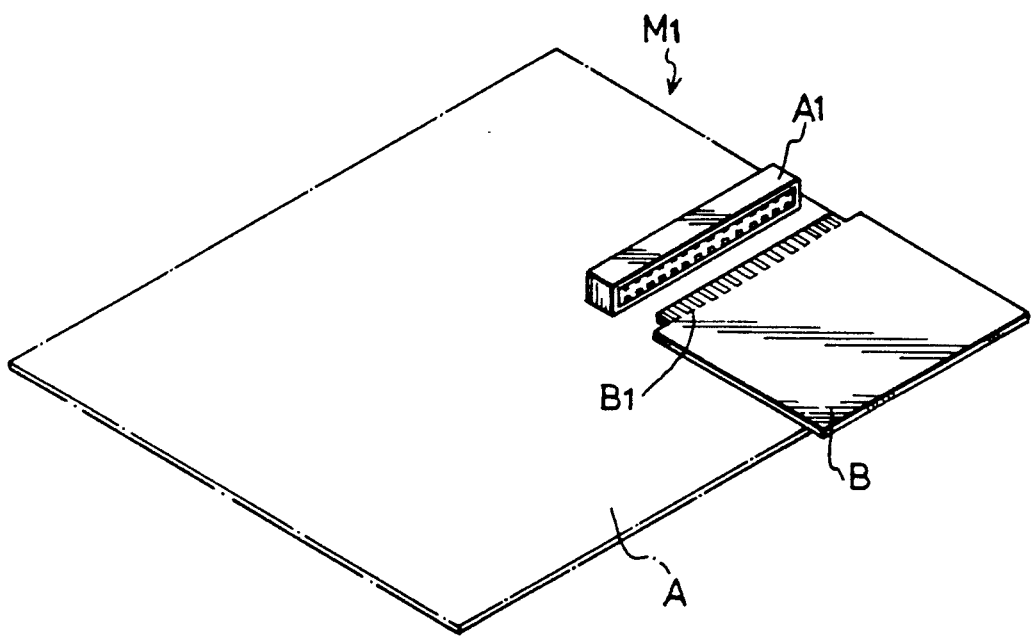
FIG. 1 is a schematic view of a conventional mother board assembly.
Figure 2:
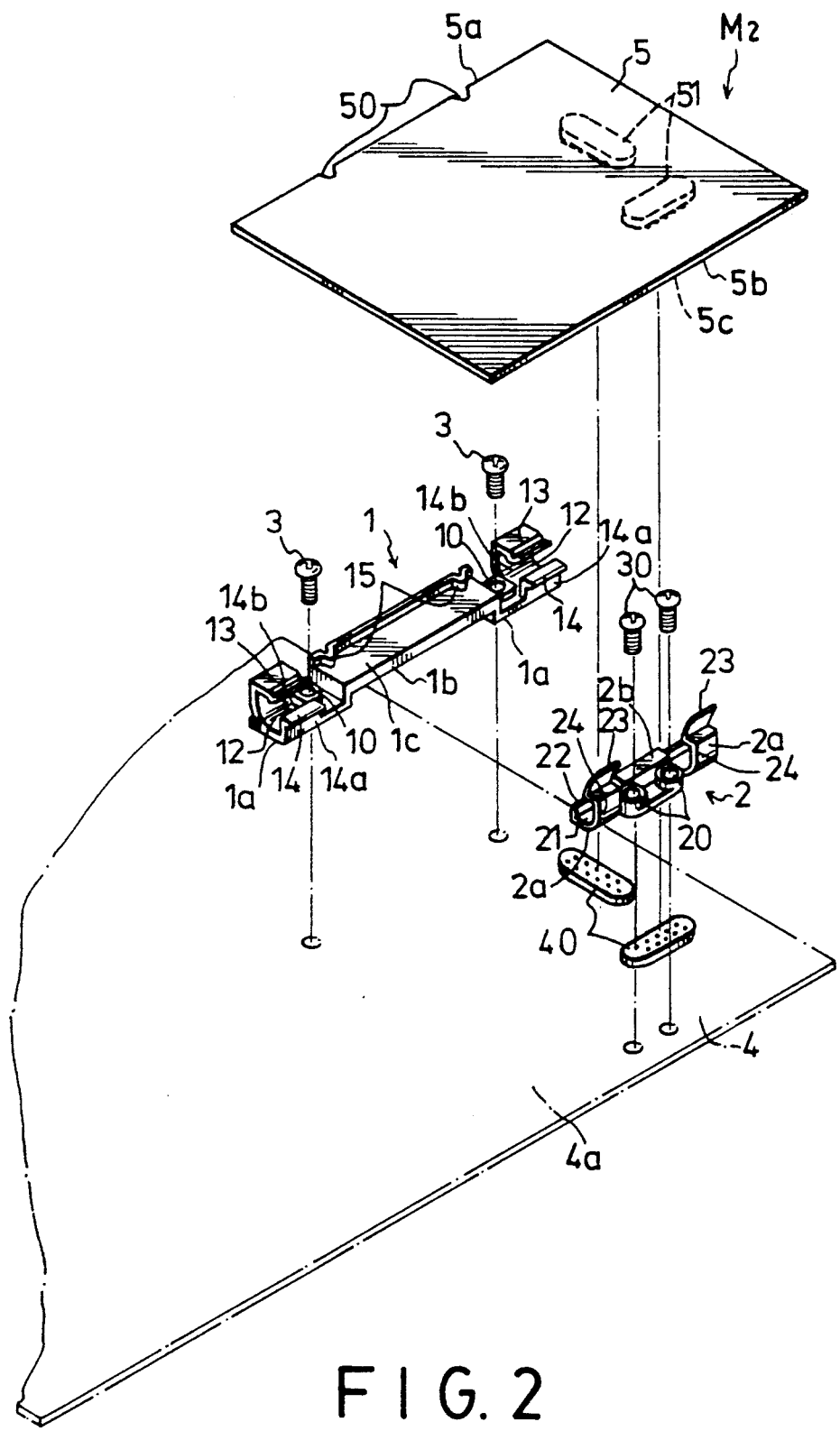
FIG. 2 is an exploded view of a mother board assembly of the present invention.
Figure 3:
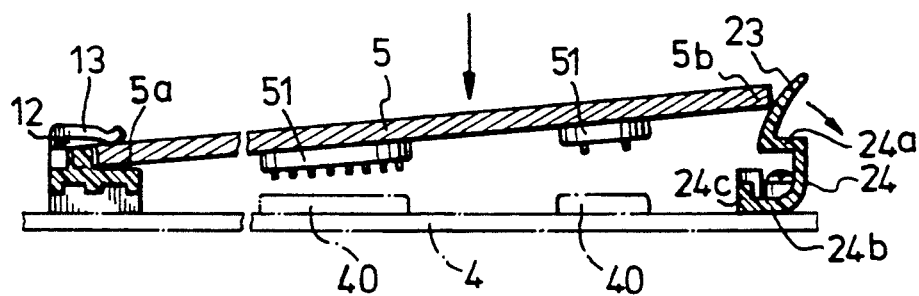
FIG. 3 is a side view of the mother board assembly shown in FIG. 2 to illustrate the mounting of an interface card onto a mother board.
Figure 4:
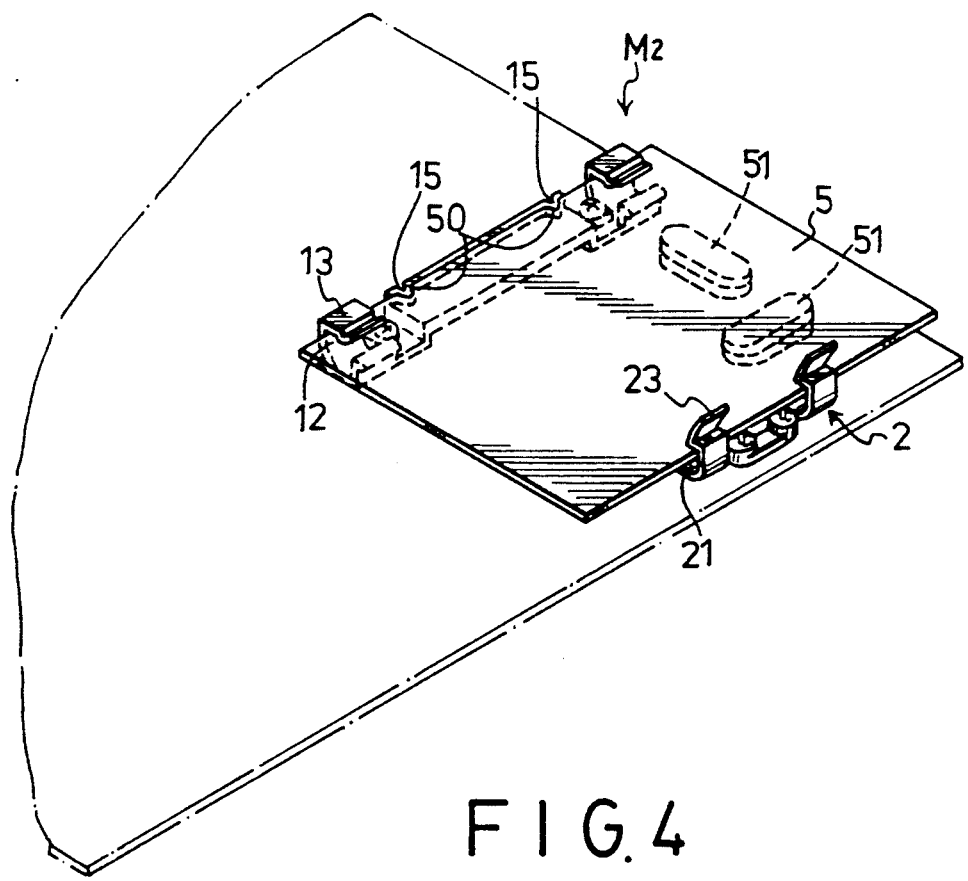
FIG. 4 is a perspective view of the mother board assembly shown in FIG. 2.

Referring to FIGS. 2 to 4, a mother board assembly (M2) of the present invention includes a mother board (4) which has a top face (4a) and a pair of socket connectors (40) mounted on the top face (4a). A first mounting seat (1) is mounted on the top face (4a) of the mother board (4) on one side of the pair of socket connectors (40) by screws (3) which pass through mounting holes (10) of the first mounting seat (1). The first mounting seat (1) includes two spaced resilient first positioning members (1a), each of which is substantially C-shaped and defines a first groove (12) therein, and a raised part (1b) which interconnects the two first positioning members (1a). Each of the first positioning members (1a) has a plate end (13), which extends horizontally, and a vertically extending end (14a) with a flange (14) formed thereon. The plate end (13) and the vertically extending end (14a) define a first access (14b) into the first groove (12). The raised part (1b) defines a flat supporting face (1c) and has two spaced horizontally extending protrusions (15) formed thereon.

A second mounting seat (2) is mounted on the top face (4a) of the mother board (4) on the other side of the pair of socket connectors (40) by screws (30) which pass through mounting holes (20) of the second mounting seat (2). The second mounting seat (2) is spaced from and is disposed opposite to the first mounting seat (1). The second mounting seat (2) includes two spaced resilient second positioning members (2a) and an intermediate part (2b) between the two second positioning members (2a). Each of the second positioning members (2a) has a substantially U-shaped retaining portion (24) with an upper free end (24a) and a lower free end (24b) and further has a flange (24c) which extends upwardly from the lower free end (24b). The retaining portion (24) defines a second groove (21) therein and has a second access (22) into the second groove (21). Each second positioning member (2a) further includes a curved plate portion (23) which extends upwardly from the upper free end (24a) of the retaining portion (24) in a direction away from the first mounting seat (1).

An interface card (5) has a front end (5a), a rear end (5b), a bottom face (5c) and a pair of plug connectors (51) mounted on the bottom face (5c) between the front and rear ends (5a, 5b). The front end (5a) of the interface card (5) is formed with two spaced notches (50) which engage the protrusions (15) of the first mounting seat (1).

The front end (5a) of the interface card (5) passes through the first accesses (14b) and into the first grooves (12) so as to be clamped resiliently between the plate ends (13) and the vertically extending ends (14a) and so as to rest on the flat supporting face (14c) of the raised part (1b). The notches (50) of the interface card (5) engage the protrusions (15) of the first mounting seat (1). The rear end (5b) of the interface card (5) is pressed downward so as to slide along the curved plate portions (23) and extend into the second grooves (21) through the second accesses (22) in order to be retained in the retaining portions (24) and to rest on the intermediate part (2b). The plug connectors (51) of the interface card (5) mate with the socket connectors (40) of the mother board (4), respectively. Thus, the interface card (5) is stably retained in the first and second mounting seats (1, 2) while providing proper electrical connection between the socket connectors (40) of the mother board (4) and the plug connectors (51) of the interface card (5). The rear end (5b) of the interface card (5) is permitted to be released from the retaining portions (24) of the second positioning members (2a) when the curved plate portions (23) are pulled rearwardly so as to allow the front end (5a) of the interface card (5) to be drawn out of the first positioning members (1a). The interface card (5) can therefore be easily removed from the first and second mounting seats (1, 2).

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangement.

I claim:

1. A mother board assembly, comprising:

a mother board having a top face and a first connector mounted on said top face;

a first mounting seat mounted on said top face of said mother board on one side of said first connector and including at least one resilient first positioning member, said first positioning member being substantially C-shaped and defining a first groove therein, said first positioning member having two spaced free ends which define a first access into said first groove;

a second mounting seat mounted on said top face of said mother board on the other side of said first connector, said second mounting seat being spaced from and being disposed opposite to said first mounting seat, said second mounting seat including at least one resilient second positioning member which has a substantially U-shaped retaining portion that defines a second groove therein and that has a second access into said second grove, said second positioning member further having a curved plate portion extending upwardly from said U-shaped retaining portion in a direction away from said first mounting seat;

an interface card having a front end, a rear end, a bottom face and a second connector mounted on said bottom face between said front and rear ends;

said front end of said interface card passing through said first access into said first groove so as to be clamped resiliently between said free ends of said first positioning member, said rear end of said interface card being pressed downward so as to slide along said curved plate portion and extend into said second groove through said second access in order to be retained in said U-shaped retaining portion, and said second connector of said interface card mating with said first connector of said mother board so as to achieve electrical connection between said interface card and said mother board.

2. A mother board assembly claimed in claim 1, wherein said front end of said interface card is formed with a notch, and said first mounting seat is further provided with a protrusion portion which engages said notch when said first end of said interface card is clamped in said first positioning member.

3. A mother board assembly claimed in claim 1, wherein one of said first and second connectors is a socket connector and the other of said first and second connectors is a plug connector.

* * * * *